US010558252B2

(12) United States Patent
Phan

(10) Patent No.: US 10,558,252 B2
(45) Date of Patent: Feb. 11, 2020

(54) METHOD AND SYSTEM FOR POWERING MULTIPLE COMPUTER PLATFORMS IN SYMMETRIC CONFIGURATION

(71) Applicant: Super Micro Computer, Inc., San Jose, CA (US)

(72) Inventor: Manhtien Phan, Morgan Hill, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 16/267,310

(22) Filed: Feb. 4, 2019

(65) Prior Publication Data

US 2019/0171271 A1 Jun. 6, 2019

Related U.S. Application Data

(63) Continuation of application No. 15/444,836, filed on Feb. 28, 2017, now Pat. No. 10,198,055, which is a continuation of application No. 12/870,831, filed on Aug. 29, 2010, now Pat. No. 9,583,918, which is a continuation-in-part of application No. 11/548,694, filed on Oct. 11, 2006, now Pat. No. 7,813,146.

(60) Provisional application No. 60/826,935, filed on Sep. 26, 2006.

(51) Int. Cl.
| | |
|---|---|
| H02B 1/00 | (2006.01) |
| G06F 1/30 | (2006.01) |
| H02B 1/20 | (2006.01) |
| H04Q 1/14 | (2006.01) |
| H04Q 1/06 | (2006.01) |
| H05K 3/42 | (2006.01) |
| G06F 1/18 | (2006.01) |

(52) U.S. Cl.
CPC ............. *G06F 1/30* (2013.01); *G06F 1/189* (2013.01); *H02B 1/202* (2013.01); *H04Q 1/06* (2013.01); *H04Q 1/14* (2013.01); *H05K 3/429* (2013.01)

(58) Field of Classification Search
USPC .................. 361/748, 760, 792, 794, 741
See application file for complete search history.

(56) References Cited

U.S. PATENT DOCUMENTS

| | | | |
|---|---|---|---|
| 566,557 | A | 8/1896 | Bayles et al. |
| 5,507,650 | A | 4/1996 | Larabell |
| 5,564,024 | A | 10/1996 | Pemberton |
| 5,668,417 | A | 9/1997 | Wiscombe et al. |
| 6,098,127 | A | 8/2000 | Kwang |
| 6,525,926 | B1 | 2/2003 | Chen |
| 6,548,986 | B1 | 4/2003 | Jakubowski |
| 6,659,803 | B1 | 12/2003 | Chen |
| 6,669,513 | B2 | 12/2003 | Huang |

(Continued)

*Primary Examiner* — Hung S. Bui
(74) *Attorney, Agent, or Firm* — Artegis Law Group, LLP

(57) ABSTRACT

Techniques pertaining to powering multiple platforms with a minimum impact on air passage in a predefined environment are disclosed. Instead of connecting each of the platforms in a chassis to a power supply therein, embodiments of the present invention uses what is referred to as cascading powering to power all platforms within minimum cable delivery. According to one embodiment of the present invention, a motherboard is disposed between two power supply units that are used to power the motherboard. The motherboard has power connectors located towards or near the power supply units so that only short cables are needed to power the platform.

20 Claims, 7 Drawing Sheets

(56) References Cited

U.S. PATENT DOCUMENTS

| | | | |
|---|---|---|---|
| 7,212,420 B2 * | 5/2007 | Liao | H01R 13/6675 |
| | | | 363/146 |
| 7,229,294 B1 | 6/2007 | Patel et al. | |
| 7,279,634 B1 | 10/2007 | Chang | |
| 7,316,586 B2 | 1/2008 | Anderson et al. | |
| 7,401,239 B2 | 7/2008 | Chan et al. | |
| 7,514,816 B2 | 4/2009 | Bemat et al. | |
| 7,573,159 B1 * | 8/2009 | DeIuliis | H01R 31/065 |
| | | | 307/150 |
| 7,873,842 B2 * | 1/2011 | Chen | G06F 1/189 |
| | | | 439/188 |
| 8,671,295 B2 | 3/2014 | Horvath et al. | |
| 9,844,156 B2 | 12/2017 | Howard et al. | |
| 2005/0041389 A1 | 2/2005 | Martin et al. | |
| 2005/0276015 A1 | 12/2005 | Wong | |
| 2005/0276023 A1 | 12/2005 | Zansky et al. | |
| 2007/0081308 A1 | 4/2007 | Ishida | |
| 2014/0101463 A1 | 4/2014 | Ju et al. | |
| 2016/0327997 A1 * | 11/2016 | Lu | G06F 1/26 |
| 2017/0060214 A1 | 3/2017 | Yang | |

\* cited by examiner

METHOD AND SYSTEM FOR POWERING MULTIPLE COMPUTER PLATFORMS IN SYMMETRIC CONFIGURATION

CROSS-REFERENCE TO RELATED APPLICATIONS

This application is a continuation of the co-pending U.S. patent application titled, "METHOD AND SYSTEM FOR POWERING MULTIPLE COMPUTER PLATFORMS IN SYMMETRIC CONFIGURATION," filed Feb. 28, 2017 and having application Ser. No. 15/444,836, which is a continuation of U.S. patent application titled, "METHOD AND SYSTEM FOR POWERING MULTIPLE COMPUTER PLATFORMS IN SYMMETRIC CONFIGURATION," filed on Aug. 29, 2010 and having application Ser. No. 12/870,831, now U.S. Pat. No. 9,583,918, which is a continuation-in-part of U.S. patent application titled, "METHOD AND SYSTEM FOR POWERING MULTIPLE COMPUTER PLATFORMS," filed on Oct. 11, 2006 and having application Ser. No. 11/548,694, now U.S. Pat. No. 7,813,146, which claims priority benefit of the United States Provisional Patent Application titled, "METHOD AND SYSTEM FOR POWERING MULTIPLE COMPUTER PLATFORMS," filed on Sep. 26, 2006 and having Application No. 60/826,935. The subject matter of these related applications is hereby incorporated herein by reference.

BACKGROUND OF THE INVENTION

Field of the Invention

The present invention generally relates to the area of powering computing systems, and more particularly, relates to techniques for powering multiple computer platforms or boards in a predefined housing with a minimum impact on the air passage therein.

Description of the Related Art

Mountable chassis are often used to house computer boards. Each chassis functions independently and therefore includes at least one platform or board and one power supply. FIG. 1 shows an exemplary way commonly used to power a single platform 102 in a chassis 100. The platform 102 is powered by a power supply 104 through a multiple-pin cable 106. As shown in FIG. 1, a connector for receiving the cable 106 on the platform 102 is often located near the power supply 104 so that the cable delivery (e.g., the cable length) is short.

The Industry standard of power delivery uses one or more ATX or extended ATX power supplies with a 20 or 24 pin cable to power a single computer platform. In one standard, a 20-pin and a 24-pin cable are defined respectively as follows:

(Supermicro Defined) Standard 20-Pin Definition

| Pin | Definition no connected |
|---|---|
| 2 | no connected |
| 3 | GROUND |
| 4 | GROUND |
| 5 | GROUND |
| 6 | GROUND |
| 7 | 12 V |
| 8 | 12 V |
| 9 | 12 V |
| 10 | 12 V |
| 12 | 5 V STBY |
| 13 | GROUND |
| 14 | GROUND |
| 15 | GROUND |
| 16 | GROUND |
| 17 | 12 V |
| 18 | 12 V |
| 19 | 12 V |
| 20 | 12 V |

(Industrial Defined) Standard 24/20-Pin Definition

| Pin | Definition 3.3 V |
|---|---|
| 2 | 3.3 V |
| 3 | GROUND |
| 4 | 5 V |
| 5 | GROUND |
| 6 | 5 V |
| 7 | GROUND |
| 8 | POWER GOOD |
| 9 | 5 V STANDBY |
| 10 | 12 V |
| 11 | 12 V |
| 12 | 3.3 V |
| 14 | −12 V |
| 15 | GROUND |
| 16 | PSON# |
| 17 | GROUND |
| 18 | GROUND |
| 19 | GROUND |
| 20 | −5 |
| 21 | 5 V |
| 22 | 5 V |
| 23 | 5 V |
| 24 | GROUND |

When there is a need to have multiple platforms in a chassis, a traditional way is to have the power supply in the chassis to power these platforms in parallel. FIG. 2 shows one exemplary way commonly used to power two individual platforms 202 and 204 housed in a chassis 200. Both platforms 202 and 204 are powered by a power supply 206 via two separate cables 208 and 210. It may be appreciated that as the number of the platforms increases, the cable delivery from the power supply to the platforms increases, a large amount of cabling in a chassis may subsequently block cooling air passage or at least narrow down the already squeezed cooling air passage in the chassis.

There is, therefore, a need for improved techniques that power multiple platforms with a minimum impact on the air passage in a predefined environment (e.g., a chassis).

SUMMARY

This section is for the purpose of summarizing some aspects of embodiments of the present invention and to briefly introduce some preferred embodiments. Simplifications or omissions in this section as well as the title and the abstract of this disclosure may be made to avoid obscuring the purpose of the section, the title and the abstract. Such simplifications or omissions are not intended to limit the scope of the present invention.

One embodiment of the present invention sets forth an enclosed computing system for powering a mother board. The system includes a mother board having a first side and a second side opposite to the first side, a first power supply unit that is connected the mother board via a first short cable, wherein the first power supply unit is disposed immediately adjacent to the first side of the motherboard, and wherein the first short cable is configured to transfer power at different voltage levels as well as control signals from the first power supply unit to the mother board; and a power supply unit that is connected to the mother board via a second short cable, wherein the second power supply is disposed immediately adjacent to the second side of the motherboard, and wherein the second short cable is configured to transfer power at different voltage levels as well as control signals from the second power supply unit to the mother board.

Other objects, features, and advantages of the present invention will become apparent upon examining the following detailed description of an embodiment thereof, taken in conjunction with the attached drawings.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION

The detailed description of the invention is presented largely in terms of procedures in terms of procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
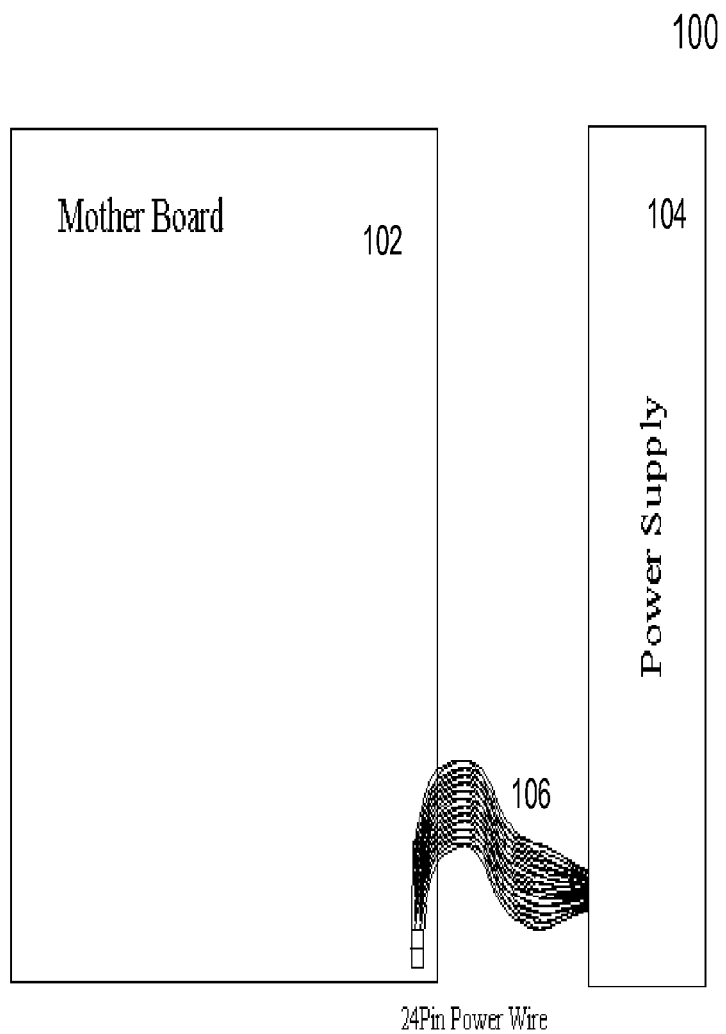
FIG. 1 shows an exemplary way commonly used to power a single platform in a chassis.
Figure 2:
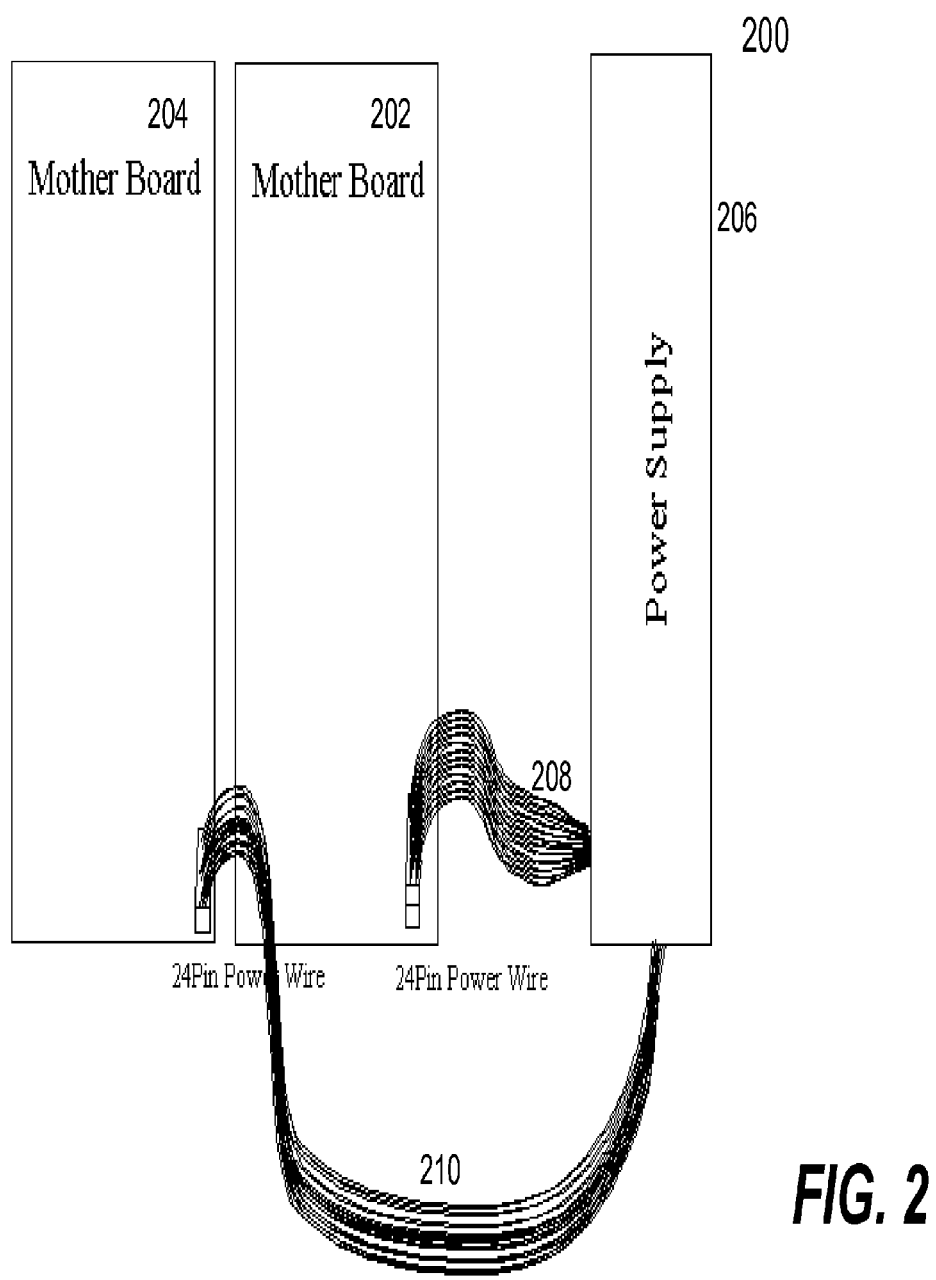
FIG. 2 shows an exemplary way commonly used to power two individual platforms in a chassis.
Figure 3:
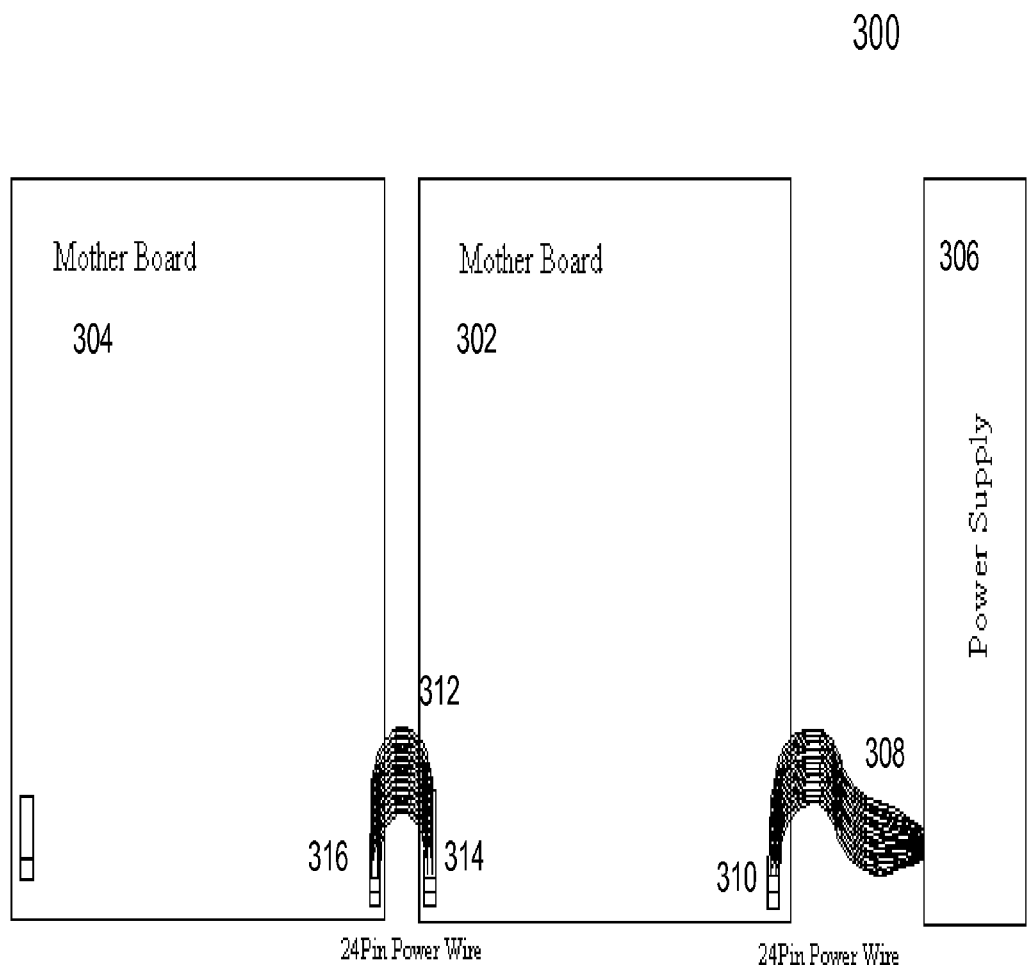
FIG. 3 shows an exemplary block diagram of powering two individual platforms according to one embodiment of the present

Referring now to the drawings, in which like numerals refer to like parts throughout the several views. According to one embodiment of the present invention, FIG. 3 shows an exemplary block diagram of powering two individual mother boards 302 and 304. The first mother board 302 is powered directly by a 24-pin power cable from the power supply 306. The first mother board 302 is configured to include a pair of power connectors 310 and 314. As illustrated in the figure, the power connector 310 is used to be connected to the power supply 306. The first mother board 302 then passes the power and any control signals, if there are any, to the second mother board 304 via the connectors 314 and 316. Because the two corresponding connectors 314 and 316 are physically near to each other, the cable 312 connecting them shall be of small or short. Similarly, the cable 308 shall be of small or short.

In other words, when there are a number of computing platforms, these platforms are cascaded to be powered by a single power supply so as to reduce the wiring or cable delivery. Such cascading powering can reduce wiring of power delivery to multiple platforms in rack mountable chassis of 1 U, 2U and up. Consequently, the cascading powering reduces the use of a lot of wires that otherwise would block (cooling) air passage in a predefined environment (e.g., a chassis).

Figure 4:
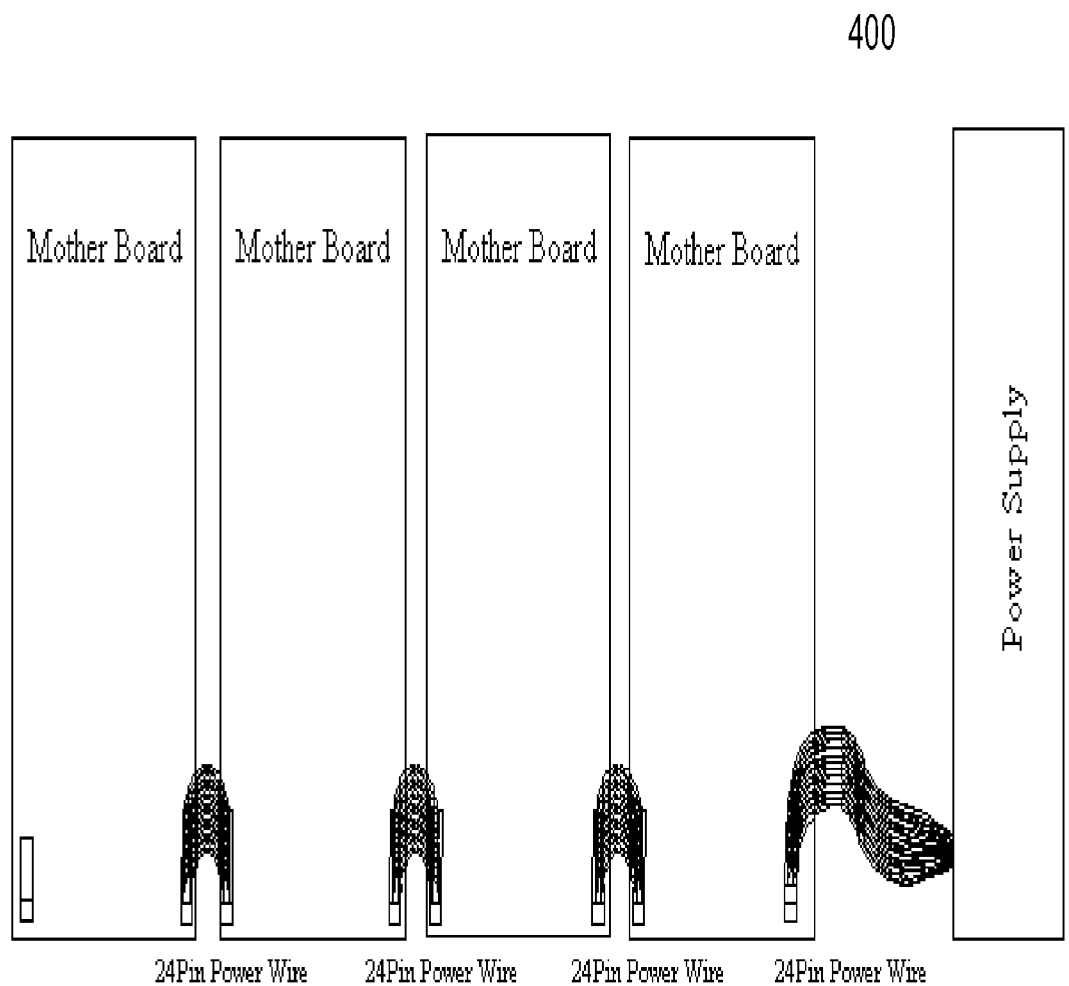
FIG. 4 shows a configuration of powering a number of computer boards by cascading.

FIG. 4 shows a configuration 400 of powering a number of boards by cascading. Because the wiring delivery happens only between two adjacent boards, the wiring itself would not significantly affect the air passage in a chassis. It can be appreciated that the cascading powering can be extended to many boards as long as the power supply is sufficient in power.

Figure 5:
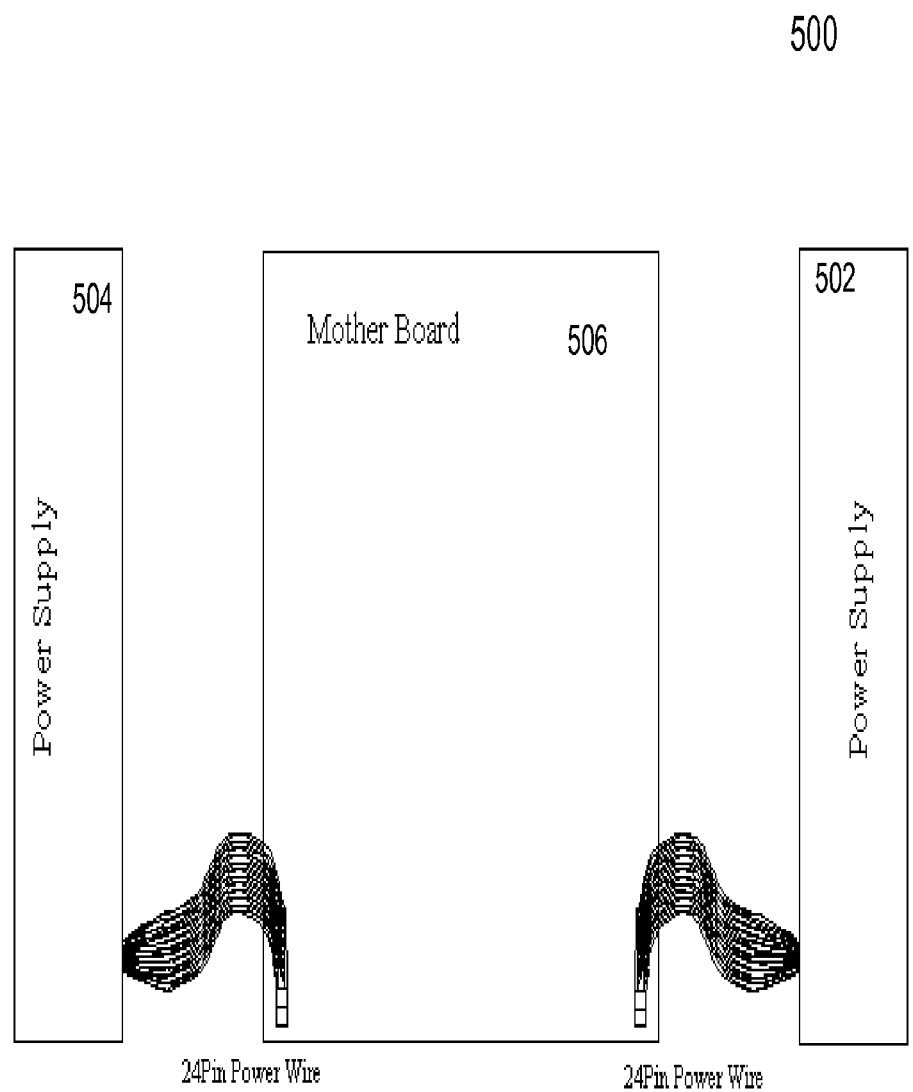
FIG. 5 shows a configuration of providing a backup power supply, such configuration being readily extended to one embodiment of the present invention, in which all platforms may be serially cascaded to be coupled to the backup power supply.

For redundant purpose of power supplies, according to one embodiment, a secondary or backup power supply is provided. Thus one platform may use two identical power connectors with two power supplies or either one of them. FIG. 5 shows a configuration 500 of providing two power supplies 502 and 504 to a mother board 506. In one embodiment, one of the two power supplies 502 and 504 is primary the other one is a secondary or backup. In the event that the primary one fails, the second one can be figured to automatically step in to continue the power supply.

To use the configuration illustrated in FIG. 5, in one embodiment, each of the platforms to be powered is equipped with two identical power connectors, each for being cascaded for one power supply to ensure the redundancy.

Figure 6:
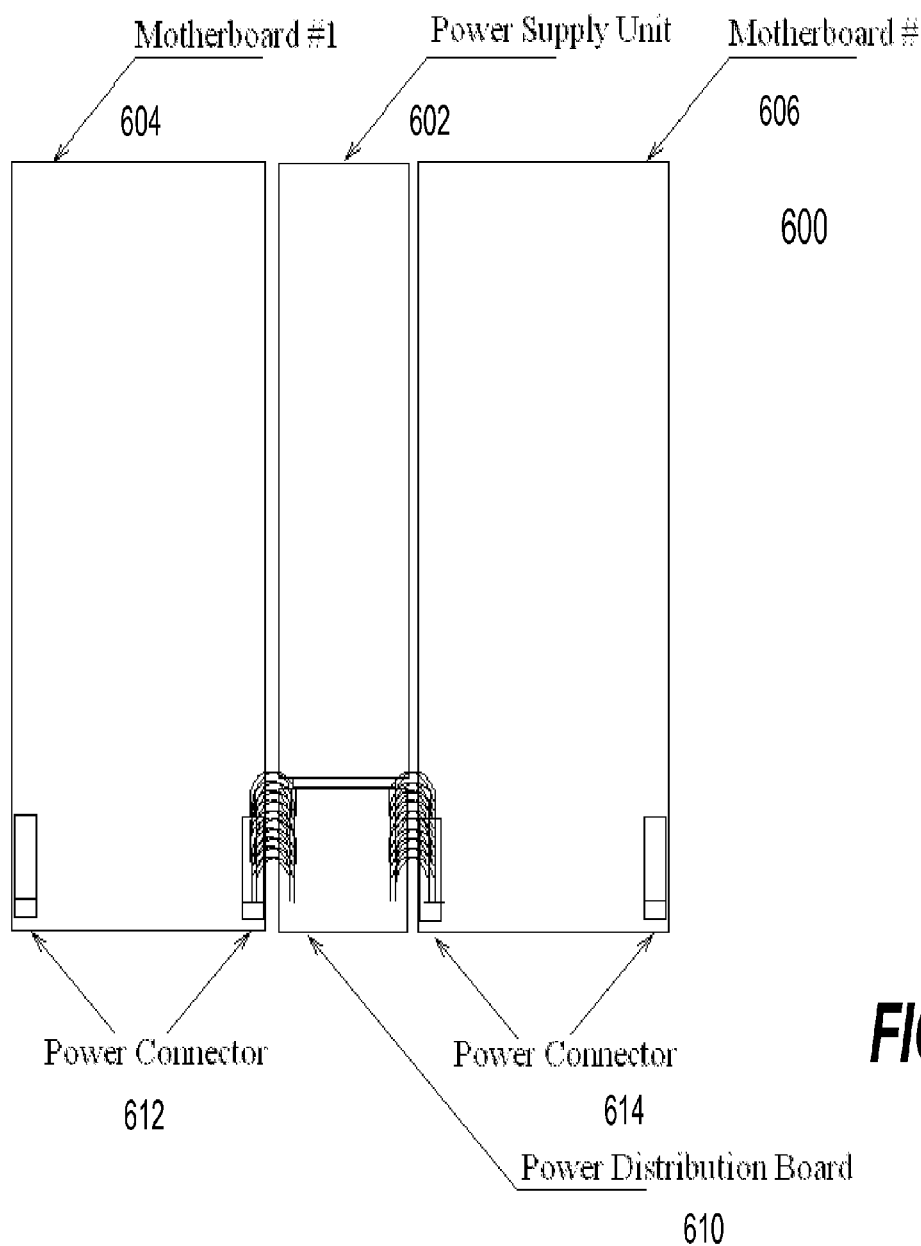
FIG. 6 shows an exemplary block diagram of a power supply centrally located or between two platforms.

FIG. 6 shows an exemplary block diagram of a power supply 602 centrally located. It is a symmetric configuration with reference to the power supply 602 that is provided to power two individual mother boards 604 and 606. Each of the mother boards 604 and 606 is disposed on one side of the power supply 602 and both of the mother boards 604 and 606 are powered at the same time.

Accordingly to one embodiment, the power supply 602 includes a distribution board 610 provided to distribute the power equally to both sides thereof. The power supply 602 may supply multiple levels of voltage and be redistributed by the distribution board 610. A 24-pin power cable is used to power one of the boards 604 and 606.

Figure 7:
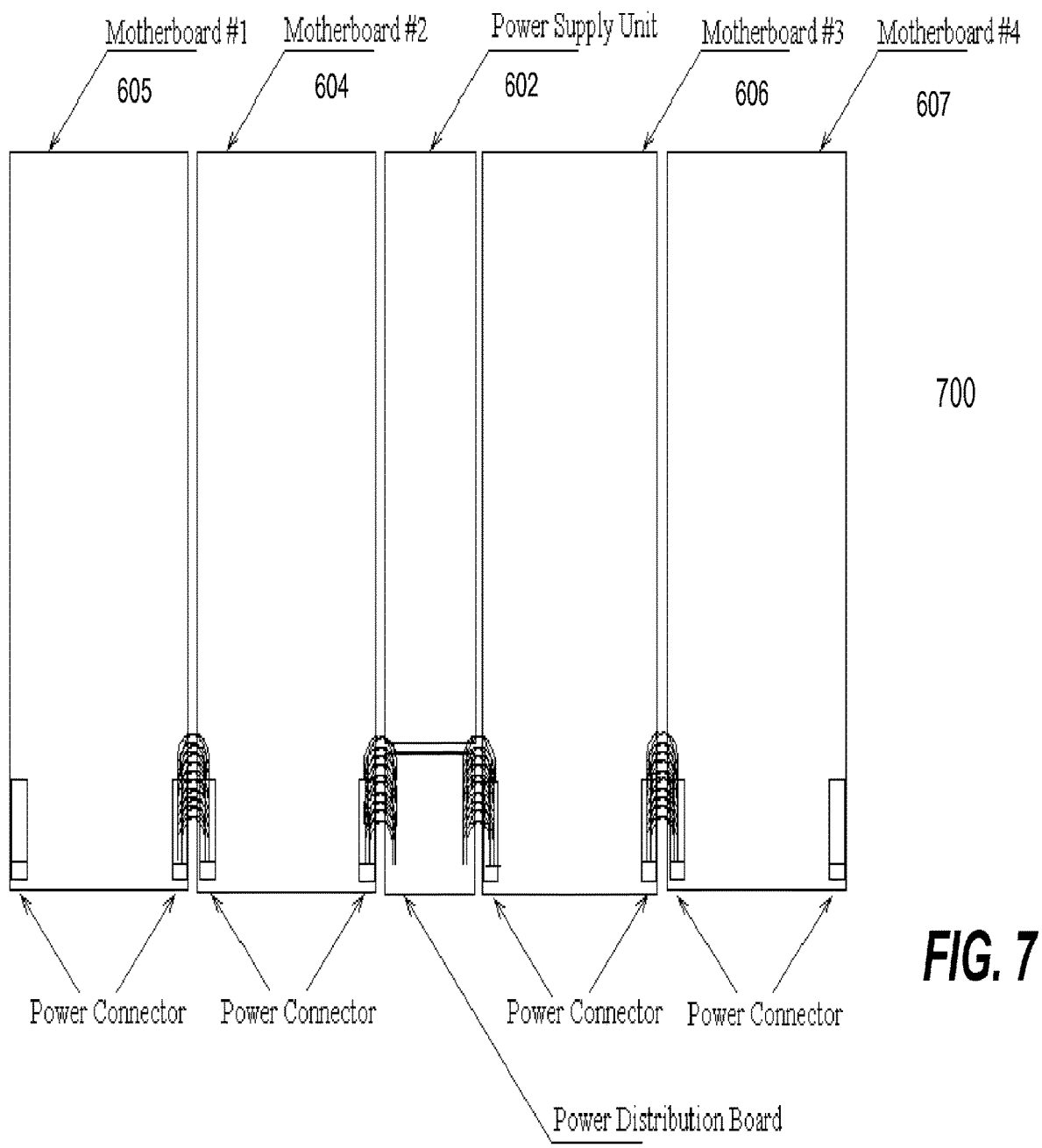
FIG. 7 shows a power supply centrally located powering multiple platforms on one side.

Accordingly to one embodiment, each of the mother board 604 and 606 is configured to include a pair of power connectors 612 and 614. As illustrated in the figure, one of the power connectors 612 is used to be connected to the power supply 602 or distribution board 610. The mother board 604 then passes the power and any control signals, if there are any, to a second mother board 605 via the connectors 612 and 613 as shown in FIG. 7. Because the two corresponding connectors 612 and 613 are physically near to each other, the cable from the mother board 604 to the mother board 605 can be of small or short. Similarly, the cable from the mother board 606 to the mother board 607 can be of small or short. As a result, these cables would not block the passage of ventilation within a device (e.g., a blade server) having multiple mother boards.

One of the features in the present invention is to power multiple platforms with minimized wiring delivery so as to reduce the blockage of air passage. The foregoing description of embodiments is illustrative of various aspects/embodiments of the present invention. Various modifications to the present invention can be made to the preferred embodiments by those skilled in the art without departing from the true spirit and scope of the invention as defined by the appended claims. Accordingly, the scope of the present invention is defined by the appended claims rather than the foregoing description of embodiments

The invention claimed is:

1. A method for powering multiple mother boards in an enclosed computing environment, the method comprising:
   connecting a first short cable to a power supply unit and to a first mother board to couple the power supply unit disposed immediately adjacent to a first side of the first mother board, wherein the first short cable is configured to transfer power at different voltage levels as well as control signals from the power supply unit to the first mother board; and
   coupling a second mother board to the power supply unit via a second short cable, wherein the second mother board is disposed immediately adjacent to a second side of the first mother board that is opposite to the first side of the first mother board, and wherein the second short cable is configured to transfer power at different voltage levels as well as control signals to the second mother board.

2. The method of claim 1, wherein coupling the second mother board to the power supply unit via the second short cable comprises connecting the second short cable to the first mother board and to the second mother board, and wherein the second short cable is configured to transfer power at different voltage levels as well as control signals to the second mother board via the first mother board.

3. The method of claim 2, wherein the first mother board includes a first connector to which the first short cable is connected and a second connector to which the second short cable is connected.

4. The method of claim 3, wherein the first connector is disposed on the first side of the first mother board, and the second connector is disposed on the second side of the first mother board.

5. The method of claim 4, wherein the second mother board includes a third connector to which the second short cable is connected, wherein the third connector is disposed on a first side of the second mother board, and wherein the first side of the second mother board is immediately adjacent to the second side of the first mother board.

6. The method of claim 2, further comprising:
   coupling a third mother board to the power supply unit via a third short cable, wherein the third short cable is configured to transfer power at different voltage levels as well as control signals to the third mother board.

7. The method of claim 6, wherein coupling the third mother board to the power supply unit via the third short cable comprises connecting the third short cable to the second mother board and to the third mother board.

8. The method of claim 6, further comprising:
   coupling a fourth mother board to the power supply unit via a fourth short cable, wherein the fourth short cable is configured to transfer power at different voltage levels as well as control signals to the fourth mother board.

9. An enclosed computing system for powering multiple mother boards, the system comprising:
   a first mother board having a first side and a second side opposite to the first side;
   a power supply unit that is connected to the first mother board via a first short cable, wherein the power supply unit is disposed immediately adjacent to the first side of the first motherboard, and wherein the first short cable is configured to transfer power at different voltage levels as well as control signals from the power supply unit to the first mother board; and
   a second mother board that is coupled to the power supply via a second short cable, wherein the second mother board is disposed immediately adjacent to the second side of the first motherboard, and wherein the second short cable is configured to transfer power at different voltage levels as well as control signals to the second mother board.

10. The system of claim 9, wherein the second mother board is connected to the first mother board via the second short cable, and wherein the second short cable is configured to transfer power at different voltage levels as well as control signals to the second mother board via the first mother board.

11. The system of claim 10, wherein the first mother board includes a first connector to which the first short cable is connected and a second connector to which the second short cable is connected.

12. The system of claim 11, wherein the first connector is disposed on the first side of the first mother board, and the second connector is disposed on the second side of the first mother board.

13. The system of claim 12, wherein the second mother board includes a third connector to which the second short cable is connected, wherein the third connector is disposed on a first side of the second mother board, and wherein the first side of the second mother board is immediately adjacent to the second side of the first mother board.

14. The system of claim 10, further comprising:
   a third mother board that is coupled to the power supply unit via a third short cable, wherein the third short cable is configured to transfer power at different voltage levels as well as control signals to the third mother board.

15. The system of claim 14, wherein the third short cable is connected to the second mother board via the third short cable, and wherein the third short cable is configured to transfer power at different voltage levels as well as control signals to the third mother board via the second mother board.

16. The system of claim 14, further comprising:
a fourth mother board that is coupled to the power supply unit via a fourth short cable, wherein the fourth short cable is configured to transfer power at different voltage levels as well as control signals to the fourth mother board.

17. A system, comprising:
a first mother board having a first side and a second side opposite to the first side;
a power supply unit that is connected to the first mother board via a first short cable, wherein the power supply unit is disposed immediately adjacent to the first side of the first motherboard, and wherein the first short cable is configured to transfer power at different voltage levels as well as control signals from the power supply unit to the first mother board; and
a second mother board that is coupled to the power supply via a second short cable, wherein the second mother board is disposed immediately adjacent to the second side of the first motherboard, and wherein the second short cable is configured to transfer power at different voltage levels as well as control signals to the second mother board.

18. The system of claim 17, wherein the second mother board is connected to the first mother board via the second short cable, and wherein the second short cable is configured to transfer power at different voltage levels as well as control signals to the second mother board via the first mother board.

19. The system of claim 18, wherein the first mother board includes a first connector to which the first short cable is connected and a second connector to which the second short cable is connected, wherein the first connector is disposed on the first side of the first mother board, and the second connector is disposed on the second side of the first mother board.

20. The system of claim 18, further comprising:
a third mother board that is coupled to the power supply unit via a third short cable, wherein the third short cable is configured to transfer power at different voltage levels as well as control signals to the third mother board.

\* \* \* \* \*